US011316093B2

(12) United States Patent
Delamare et al.

(10) Patent No.: US 11,316,093 B2
(45) Date of Patent: *Apr. 26, 2022

(54) ELECTRICITY GENERATOR COMPRISING A MAGNETO-ELECTRIC CONVERTER AND METHOD OF PRODUCTION

(71) Applicant: Enerbee, Grenoble (FR)

(72) Inventors: Jérôme Delamare, Grenoble (FR); Thibault Ricart, Seyssinet Pariset (FR); Jérémie Guillen, Grenoble (FR)

(73) Assignee: Enerbee, Grenoble (FR)

(*) Notice: Subject to any disclaimer, the term of this patent is extended or adjusted under 35 U.S.C. 154(b) by 604 days.

This patent is subject to a terminal disclaimer.

(21) Appl. No.: 16/093,550

(22) PCT Filed: Apr. 14, 2017

(86) PCT No.: PCT/FR2017/050906
§ 371 (c)(1),
(2) Date: Oct. 12, 2018

(87) PCT Pub. No.: WO2017/178773
PCT Pub. Date: Oct. 19, 2017

(65) Prior Publication Data
US 2019/0131514 A1 May 2, 2019

(30) Foreign Application Priority Data
Apr. 15, 2016 (FR) .................... FR1653359

(51) Int. Cl.
H01L 41/06 (2006.01)
H01L 41/20 (2006.01)
(Continued)

(52) U.S. Cl.
CPC ............ *H01L 41/047* (2013.01); *H01L 41/00* (2013.01); *H01L 41/06* (2013.01); *H01L 41/20* (2013.01);
(Continued)

(58) Field of Classification Search
CPC ......... H01L 41/00; H01L 41/06; H01L 41/20; H01L 41/22; H01L 41/23; H01L 41/47; H01L 41/047
See application file for complete search history.

(56) References Cited

U.S. PATENT DOCUMENTS 5,176,140 A * 1/1993 Kami ................. A61B 8/12
310/327
5,652,473 A 7/1997 Delamare et al.
(Continued)

FOREIGN PATENT DOCUMENTS

JP H04-346278 A 12/1992
JP 2009-535695 A 10/2009
(Continued)

OTHER PUBLICATIONS

European Communication pursuant to Article 94(3) EPC for European Application No. 17721787, dated Nov. 26, 2019, 4 pages.
(Continued)

Primary Examiner — Shawki S Ismail
Assistant Examiner — Monica Mata
(74) Attorney, Agent, or Firm — TraskBritt

(57) ABSTRACT

A magneto-electric converter capable of converting a variation in magnetic field into a potential difference between two electrical terminals includes a support layer comprising two electrical terminals; a stack disposed on the support layer of a first layer made from a magnetostrictive material defining the reference plane and of a second layer made from a piezoelectric material having a polarization axis in the plane
(Continued)

defined by the second layer, parallel to the reference plane; the second layer comprising electrodes; and a means for electrical connection of the electrodes to the electrical terminals.

16 Claims, 4 Drawing Sheets

(51) Int. Cl.
 *H01L 41/23*   (2013.01)
 *H01L 41/47*   (2013.01)
 *H01L 41/047*   (2006.01)
 *H01L 41/22*   (2013.01)
 *H01L 41/00*   (2013.01)

(52) U.S. Cl.
 CPC .............. *H01L 41/22* (2013.01); *H01L 41/23* (2013.01); *H01L 41/47* (2013.01)

(56) References Cited

U.S. PATENT DOCUMENTS

| | | |
|---|---|---|
| 5,686,772 A | 11/1997 | Delamare et al. |
| 5,691,586 A | 11/1997 | Yonnet et al. |
| 5,893,517 A | 4/1999 | Delamare |
| 6,351,049 B1 | 2/2002 | Chassoulier et al. |
| 6,384,500 B1 | 5/2002 | Chassoulier et al. |
| 6,794,791 B2 | 9/2004 | Ben Ahmed et al. |
| 6,859,122 B2 | 2/2005 | Divoux et al. |
| 7,049,915 B2 | 5/2006 | Delamare et al. |
| 7,106,159 B2 | 9/2006 | Delamare et al. |
| 7,142,078 B2 | 11/2006 | Rostaing et al. |
| 7,834,727 B2 | 11/2010 | Delamare et al. |
| 8,653,813 B2 | 2/2014 | Ettelt et al. |
| 8,779,637 B2 | 7/2014 | O'Brien et al. |
| 8,860,403 B2 | 10/2014 | Walther et al. |
| 9,647,578 B2 | 5/2017 | Delamare et al. |
| 9,935,255 B2 | 4/2018 | Delamare et al. |
| 9,973,112 B2 | 5/2018 | Viala et al. |
| 10,014,800 B2 | 7/2018 | Viala et al. |
| 10,181,807 B2 | 1/2019 | Viala et al. |
| 11,169,184 B2 | 11/2021 | Delamare et al. |
| 2003/0057787 A1 | 3/2003 | Ahmed et al. |
| 2004/0113732 A1 | 6/2004 | Delamare et al. |
| 2004/0126620 A1 | 7/2004 | Viehland et al. |
| 2004/0183382 A1 | 9/2004 | Delamare et al. |
| 2004/0246082 A1 | 12/2004 | Divoux et al. |
| 2005/0237140 A1 | 10/2005 | Rostaing et al. |
| 2006/0145796 A1 | 7/2006 | Delamare et al. |
| 2007/0285244 A1 | 12/2007 | Tucker et al. |
| 2010/0295546 A1 | 11/2010 | Walther et al. |
| 2010/0308664 A1* | 12/2010 | Face ................ H02J 13/00036 307/104 |
| 2011/0181149 A1* | 7/2011 | Shikata ................ B06B 1/0629 310/327 |
| 2011/0248581 A1 | 10/2011 | O'Brien et al. |
| 2013/0127455 A1 | 5/2013 | Ettelt et al. |
| 2015/0287562 A1 | 10/2015 | Delamare et al. |
| 2015/0295519 A1 | 10/2015 | Viala et al. |
| 2015/0303834 A1 | 10/2015 | Viala et al. |
| 2016/0276573 A1 | 9/2016 | Delamare et al. |
| 2016/0276958 A1 | 9/2016 | Viala et al. |
| 2016/0276959 A1* | 9/2016 | Viala ..................... H01L 41/00 |
| 2019/0089269 A1 | 3/2019 | Delamare et al. |
| 2019/0131514 A1 | 5/2019 | Delamare et al. |
| 2019/0253002 A1 | 8/2019 | Delamare et al. |
| 2020/0284824 A1 | 9/2020 | Delamare et al. |
| 2021/0033296 A1 | 2/2021 | Delamare et al. |
| 2021/0202825 A1 | 7/2021 | Pouyadou et al. |

FOREIGN PATENT DOCUMENTS

| | | |
|---|---|---|
| JP | 2016-502386 A | 1/2016 |
| WO | 2015/059421 A1 | 4/2015 |

OTHER PUBLICATIONS

International Written Opinion for International Application No. PCT/FR2017/050906 dated Aug. 24, 2017, 5 pages.
International Search Report for International Application No. PCT/FR2017/050906 dated Aug. 24, 2017, 2 pages.
Japanese Office Action from Japanese Application No. 2019-505293, dated Jun. 22, 2021, 6 pages.
LaFont et al., "Magnetostrictive-piezoelectric composite structures for energy harvesting," Journal of Micromechanics and Microengineering, No. 22, (2012), pp. 1-6.

* cited by examiner

ELECTRICITY GENERATOR COMPRISING A MAGNETO-ELECTRIC CONVERTER AND METHOD OF PRODUCTION

CROSS-REFERENCE TO RELATED APPLICATIONS

This application is a national phase entry under 35 U.S.C. § 371 of International Patent Application PCT/FR2017/050906, filed Apr. 14, 2017, designating the United States of America and published as International Patent Publication WO 2017/178773 A1 on Oct. 19, 2017, which claims the benefit under Article 8 of the Patent Cooperation Treaty to French Patent Application Serial No. 1653359, filed Apr. 15, 2016.

TECHNICAL FIELD

The present disclosure relates to the field of energy recovery devices, and, in particular, to an electricity generator and a converter capable of converting a variation in magnetic energy into an electrical potential difference, in addition to an associated manufacturing method. The magneto-electric converter comprises a stack of layers of magnetostrictive and piezoelectric materials.

BACKGROUND

Magnetostriction generally corresponds to a reversible exchange of energy between a mechanical form and a magnetic form. The best known magnetostriction effect is the Joule effect. It corresponds to expansion, in the case of a positive magnetostriction coefficient, or to contraction, in the case of a negative coefficient, of a ferromagnetic rod under the influence of a magnetic field. Without a magnetic field, the bar theoretically returns to its original form. In the case of longitudinal expansion in the direction of the magnetic field, a contraction appears in the transverse directions so as to maintain the volume of the bar substantially constant.

Piezoelectricity is the generation of electrical charges under the influence of mechanical stress. Among piezoelectric materials, PZT (lead zirconate titanate) is known. PZT, equipped with two electrodes, can be prepolarized by means of heat treatment at a temperature slightly lower than its Curie temperature, during which a voltage is applied to the electrodes. The polarization axis of the material is established in this case in a direction from one electrode to the other. This polarization determines, in particular, the electrode on which an excess of electrical charges will appear in response to stress applied to the piezoelectric material. Considering a layer of PZT material, comprising a parallel upper and lower face, the polarization axis can be oriented in a direction perpendicular to the faces owing to the presence of an electrode on each face. Alternatively, the polarization axis can be oriented in a direction parallel to the faces, using interdigitated electrodes on at least one of the two faces of the layer. In the latter case, the polarization axis is parallel to the plane of the faces and perpendicular to the fingers of conductive material forming the interdigitated electrodes. In order to convert a stress/deformation into an electrical potential difference at the electrode terminals, one of two particular modes can, therefore, be adopted depending on whether the strain is perpendicular to the polarization axis (mode known as $d_{31}$) or whether the strain is parallel to the polarization axis (mode known as $d_{33}$).

Electricity generators are known from the state of the art (WO2015/059421 or also the article by T. Lafont et al., "Magnetostrictive-piezoelectric composite structures for energy harvesting," *Journal of Micromechanics and Microengineering*, No. 22, 2012) comprising a magnetic field source, the field lines of which are parallel to a reference plane and a magneto-electric converter capable of converting a variation in the magnetic field into an electrical potential difference between two electrical terminals. The converter consists, on the one hand, of an electromechanical transducer comprising a piezoelectric layer capable of transforming a mechanical deformation into an electrical potential difference between two electrical terminals connected to its electrodes. The converter is also composed of a magnetostrictive layer fixed according to the reference plane and without a degree of freedom to the electromechanical transducer, capable of converting a variation in the magnetic field into a mechanical deformation, applied to the electromechanical transducer.

The state of the art, nevertheless, does not provide for a simple, effective and compact electricity generator configuration.

BRIEF SUMMARY

One object of the present disclosure is to provide a magneto-electric converter suitable for manufacturing a simple, effective and compact electrical generator.

The disclosure primarily relates to a magneto-electric converter capable of converting a variation in the magnetic field into an electrical potential difference between two electrical terminals, wherein the converter includes:
  a backing layer comprising the two electrical terminals;
  a stack arranged on the backing layer, of a first layer of magnetostrictive material defining the reference plane and of a second layer of piezoelectric material having a first polarization axis in the plane defined by the second layer, parallel to the reference plane, wherein the second layer comprises electrodes;
  electrical connection means for connecting the electrodes to the electrical terminals.

The conversion efficiency of the converter according to the disclosure is related to the characteristics of the stack of layers. The presence of the backing layer and the connection means allow a good level of compactness.

According to advantageous characteristics of the converter according to the disclosure, taken either separately or in combination:
  the stack of layers comprises a bonding layer between the first layer and the second layer;
  the metal electrodes of the second layer are interdigitated electrodes present on at least one of its faces or on its side edge;
  the stack of layers comprises a third layer of a piezoelectric material having a second polarization axis in the plane defined by the third layer, with the first layer being arranged between the second layer and the third layer, the second polarization axis being aligned or perpendicular to the first polarization axis, better than to within 15°;
  the metal electrodes of the third layer are interdigitated electrodes present on at least one of its faces;
  the piezoelectric material is composed of PZT, PMN-PT, PVDF, BaTiO$_3$ or AlN;
  the magnetostrictive material is composed of crystalline or sintered Terfenol-D, Galfenol, Terbium Iron, Iron-Cobalt, Iron-Nickel or amorphous FeSiB;

the stack of layers and backing layer are circular in shape;

the magneto-electric converter is less than 3 cm in diameter and has a diameter-to-thickness ratio of more than 3;

the backing layer is a printed circuit;

the printed circuit includes at least one switch device for collecting the charges generated on the electrodes;

the printed circuit includes at least one storage device for storing the charges generated on the electrodes;

the printed circuit also includes at least one processing device for processing of the electrical signal induced by the charges generated on the electrodes;

the electrical connection means for connecting the electrodes to the electrical terminals comprise at least two strips of conductive adhesive material arranged on the side edge of the stack of layers and on the side edge or edge of the backing layer;

the side edge of the first layer is separated from the strips of conductive adhesive material by a layer of insulating adhesive material;

the electrical connection means for connecting the electrodes to the electrical terminals comprise at least two wire bondings;

the electrical connection means for connecting the electrodes to the electrical terminals comprise at least two conductive through vias in the stack of layers.

the converter comprises a buffer layer, the material of which has sound-absorbing properties and is arranged between the stack of layers and the backing layer.

The disclosure also relates to an electricity generator comprising:

a magneto-electric converter as above;

a source generating a magnetic field in the reference plane;

wherein the magnetic field source and the converter can rotate in relation to each other so as to vary the orientation of the magnetic field in the reference plane.

According to advantageous characteristics of the generator according to the disclosure, taken either separately or in combination:

the magnetic field source defines a housing within which the magnetic field prevails, with the converter being located in the housing; and the magnetic field source is a Halbach cylinder.

The disclosure also relates to a method of manufacturing a magneto-electric converter comprising:

a stage of providing a first layer of magnetostrictive material;

a stage of providing a second layer of a piezoelectric material having a first polarization axis in a plane defined by the second layer and comprising electrodes;

a stage of assembling the first layer with the second layer to form the stack of layers.

According to advantageous characteristics of the manufacturing method according to the disclosure, taken either separately or in combination:

the method of manufacturing a magneto-electric converter comprises a stage of providing a third layer of a piezoelectric material having a second polarization axis in a plane defined by the third layer and comprising electrodes;

the method of manufacturing a magneto-electric converter comprises a stage of assembling the first layer with the third layer, wherein the first layer is arranged between the second layer and the third layer;

the assembly stages comprise depositing adhesive on at least one of the faces of the layers to be joined and placing the faces in contact;

the method of manufacturing a magneto-electric converter comprises joining together the stack of layers with a backing layer in order to connect the electrodes of the at least one layer of piezoelectric material to two electrical terminals.

BRIEF DESCRIPTION OF THE DRAWINGS

Other features and advantages of the disclosure will emerge from the detailed description of the disclosure that follows with reference to the accompanying drawings in which.

DETAILED DESCRIPTION

Figure 1:
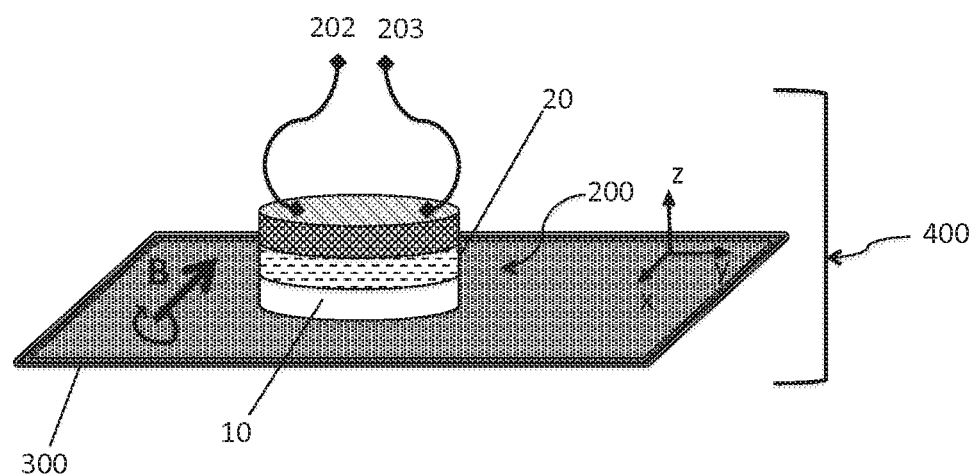
FIG. 1 shows a block diagram of an electricity generator according to the disclosure.

FIG. 1 illustrates a block diagram of an electricity generator 400 according to the disclosure. It comprises a magnetic field source 300 and a magneto-electric converter 200 capable of converting a variation in the magnetic field B into an electrical potential difference between electrical terminals 202, 203. The converter 200 comprises two electrical terminals 202, 203 and a stack consisting of a first layer 10 of magnetostrictive material defining a reference plane (x, y) and a second layer 20 of piezoelectric material. Some of the lines of the magnetic field B are parallel to the reference plane (x, y). The magnetic field source 300 and the converter 200 can rotate in relation to each other so as to vary the orientation of the magnetic field B in the reference plane.

According to the disclosure, in order to limit the overall dimensions of the electricity generator 400 (for example, on the order of one cubic centimeter), the size of the magnetic field source 300 is reduced. The field strength may be on the order of 0.3 Tesla, or between 0.1 and 0.6 Tesla. The magnetostrictive material is chosen so as to have a magnetostrictive coefficient greater than 30 ppm. This may involve crystalline or sintered Terfenol-D, Galfenol, Terbium Iron, Iron-Cobalt, Iron-Nickel or amorphous FeSiB. Subject to the magnetic field B in the reference plane (x, y), the first layer 10 of magnetostrictive material undergoes deformation along the axis parallel to the magnetic field B.

According to an advantageous aspect of the disclosure and to fulfill the requirements for compactness, the magnetic field source 300 is provided with a housing in which the magnetic field B prevails and in which the magneto-electric converter 200 is located. By way of example, the magnetic field source 300 may be a permanent magnet, such as a Halbach cylinder.

As seen in relation to FIG. 1, the converter 200 comprises a stack comprising a first layer 10 of magnetostrictive material and a second layer 20 of piezoelectric material.

The method of manufacturing the stack of layers 100 thus comprises providing a first layer 10 of magnetostrictive material. It also comprises a stage of providing a second layer 20 of piezoelectric material having a polarization axis 21 (designated "first polarization axis") in a plane defined by the second layer 20. At least one of the faces of the second layer 20 comprises electrodes, preferably interdigitated electrodes 23, 24 (FIG. 2, Panel (a)). In the latter case, its first polarization axis 21 is parallel to the plane of the faces of the second layer 20 and perpendicular to the fingers of conductive material forming the interdigitated electrodes 23, 24. The layer 20 of piezoelectric material is, therefore, preferably prepared to operate in $d_{33}$ mode, which is advantageously more sensitive than $d_{31}$ mode, which contributes to improving the efficiency of the converter.

Figure 2:
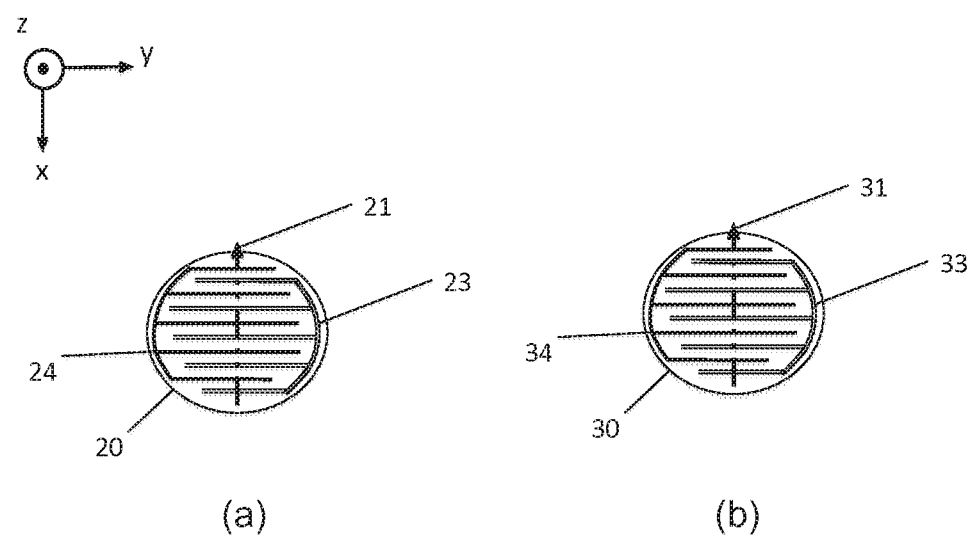
FIG. 2, Panels (a) and (b), shows a second and a third layer of piezoelectric material, adapted for the magneto-electric converter according to the disclosure.

According to a first alternative, the electrodes 23, 24 can be formed by a conductive material in contact with the face of the second layer 20; the plurality of fingers of each electrode can be connected by a semi-circular segment, as illustrated in FIG. 2, Panel (a), in the case of a second circular-shaped layer 20.

According to a second alternative, the fingers of each electrode can be connected in pairs by a conductive element, for example, wire bonding, at the face of the second layer 20 or on its side edge: this configuration makes it possible, in particular, to increase the dimension of the fingers (for example, up to the edges of the second layer 20) and, therefore, develop the active part of collection of charges on a larger surface of the face of the second layer 20.

According to a third alternative, the electrodes 23, 24 can be formed of a conductive material, arranged in the thickness of the second layer 20: each finger of an electrode present on one face of the second layer 20 extends into the thickness thereof, forming a through-blade of conductive material. Reference can be made, for example, to multilayer piezoelectric stack techniques for manufacturing the second layer 20 according to this third alternative. This configuration maximizes efficiency in collecting charges, as it utilizes the full thickness of the second layer 20. This third alternative can incorporate either of the modes of connection of the fingers of each electrode described in the first and second alternatives above, without this, of course, being restrictive.

The method for manufacturing the stack of layers 100 comprises a stage of assembling the first layer 10 with the second layer 20. The assembly stage may include, on the one hand, spreading a film or a coil of adhesive 40 on at least one of the two faces to be joined, respectively, that of the first layer 10 or the second layer 20.

Figure 3:
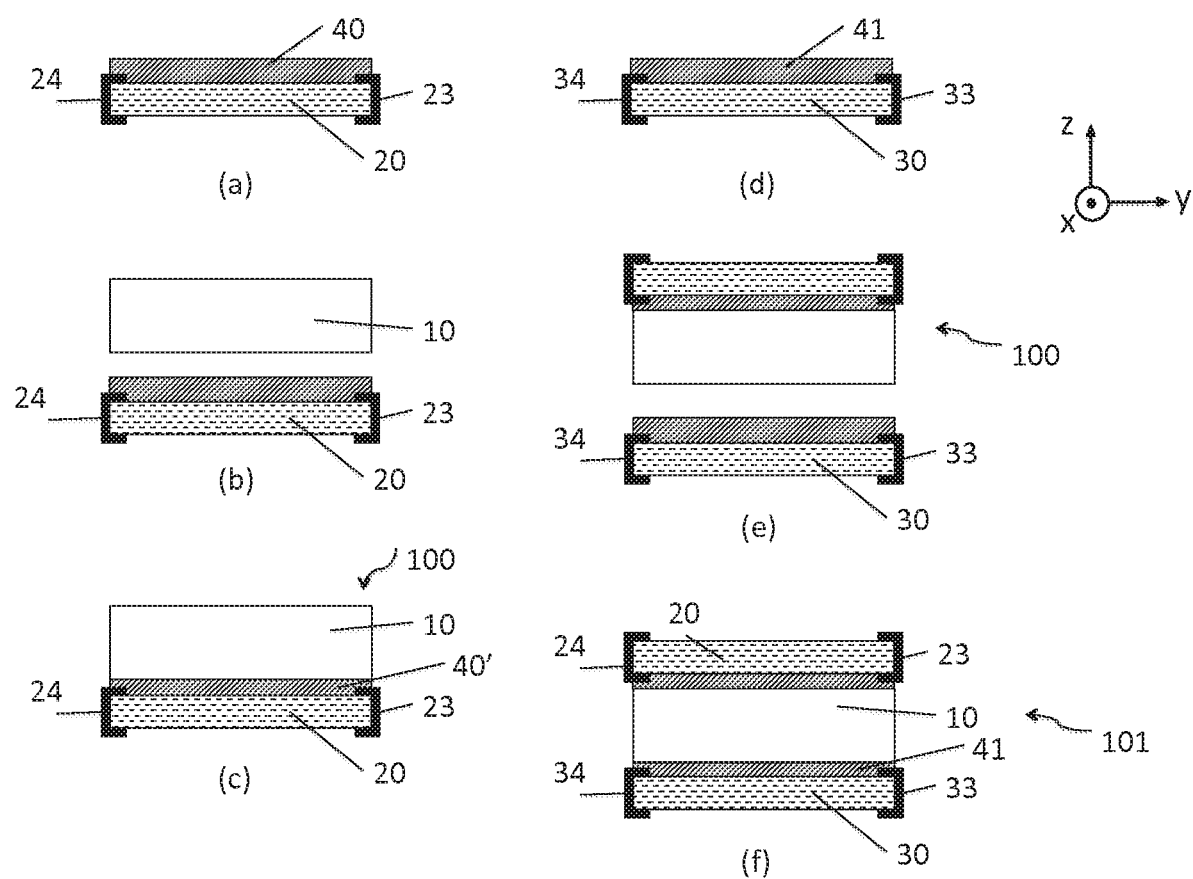
FIG. 3, Panels (a) through (f), shows a method of manufacturing a stack of layers for a magneto-electric converter according to the disclosure.

FIG. 3, Panels (a) through (f), shows such an embodiment: the adhesive film 40 is spread on the second layer 20 (FIG. 3, Panel (a)), the first layer 10 is subsequently brought opposite the second layer 20 (FIG. 3, Panel (b)). The assembly stage subsequently involves placing the faces of the first and second layers 10 and 20 to be assembled in contact with each other (FIG. 3, Panel (c)). In order to obtain a uniform layer of adhesive 40' at the interface between the two layers, uniform pressure will be applied so as to bring the two layers closer together.

The stack of layers 100 thus consists of the first layer 10 of magnetostrictive material joined to the second layer 20 of piezoelectric material, with the latter being equipped with electrodes 23, 24 on at least one of its faces.

According to one alternative, the method of manufacturing a stack of layers 101 includes a stage of providing a third layer 30 of a piezoelectric material having a polarization axis 31 (designated "second polarization axis") in a plane defined by the third layer 30 (FIG. 2, Panel (b)). Advantageously, at least one of the faces of the third layer 30 has interdigitated electrodes 33, 34 and the second polarization axis 31 is parallel to the plane of the faces and, in particular, perpendicular to the fingers of conductive material forming the interdigitated electrodes 33, 34.

The manufacturing method also comprises a stage of assembling the stack of layers 100 with the third layer 30 such that the first layer 10 is arranged between the second layer 20 and the third layer 30. Assembly is, therefore, performed between the free face of the first layer 10 (opposite face to that joined to the second layer 20) and one of the faces of the third layer 30, after spreading the film or the coil of adhesive 41. By way of example, the film of adhesive 41 is applied to a face of the third layer 30 as illustrated in FIG. 3, Panel (d). Assembly will be advantageously performed such that the first polarization axis 21 and the second polarization axis 31 are aligned or perpendicular to within 15°, for example. According to another advantageous configuration, the positioning accuracy of the first polarization axis in relation to the second polarization axis may even be better than 5°. Since the first polarization axis 21 and the second polarization axis 31 are contained in substantially parallel planes (respectively, the plane defined by the second layer 20 and the plane defined by the third layer 30), the alignment between these two axes involves limiting the angle that they form between each other, in a planar view (in the layer plane). In other words, the angle formed by the projections of these axes on a plane defined by one of the layers is less than 15° (or 5°).

The stack of layers 101 thus consists of the first layer 10 of magnetostrictive material arranged between the second layer 20 and the third layer 30 of piezoelectric material, with each being equipped with electrodes 23, 24, 33, 34 on at least one of their faces (FIG. 3, Panel (f)).

The adhesive used during the assembly stage may be selected from among different types of material in order to favor certain characteristics of the stack of layers 100, 101. The viscoelastic behavior of some adhesive materials will be advantageous in order to accommodate the differences in thermal expansion between the layers of piezoelectric material of second and third layers 20, 30 and the layer of magnetostrictive material of first layer 10. Harder and stiffer adhesive materials are preferred to ensure effective transfer of deformation from the first layer 10 to the second layer 20 and third layer 30. An adhesive interface allowing minimal slip between the layers may alternatively be produced by co-sintering the assembled layers or, furthermore, by direct bonding, without addition of adhesive material.

The piezoelectric material can be selected from among PZT, PMN-PT, PVDF, $BaTiO_3$ or AlN without this being restrictive.

The magneto-electric converter 200 according to the disclosure is capable of converting a variation in a magnetic field into an electrical potential difference between two electrical terminals 202, 203. It comprises either of the stacks of layers 100, 101 as described above.

Figure 4:
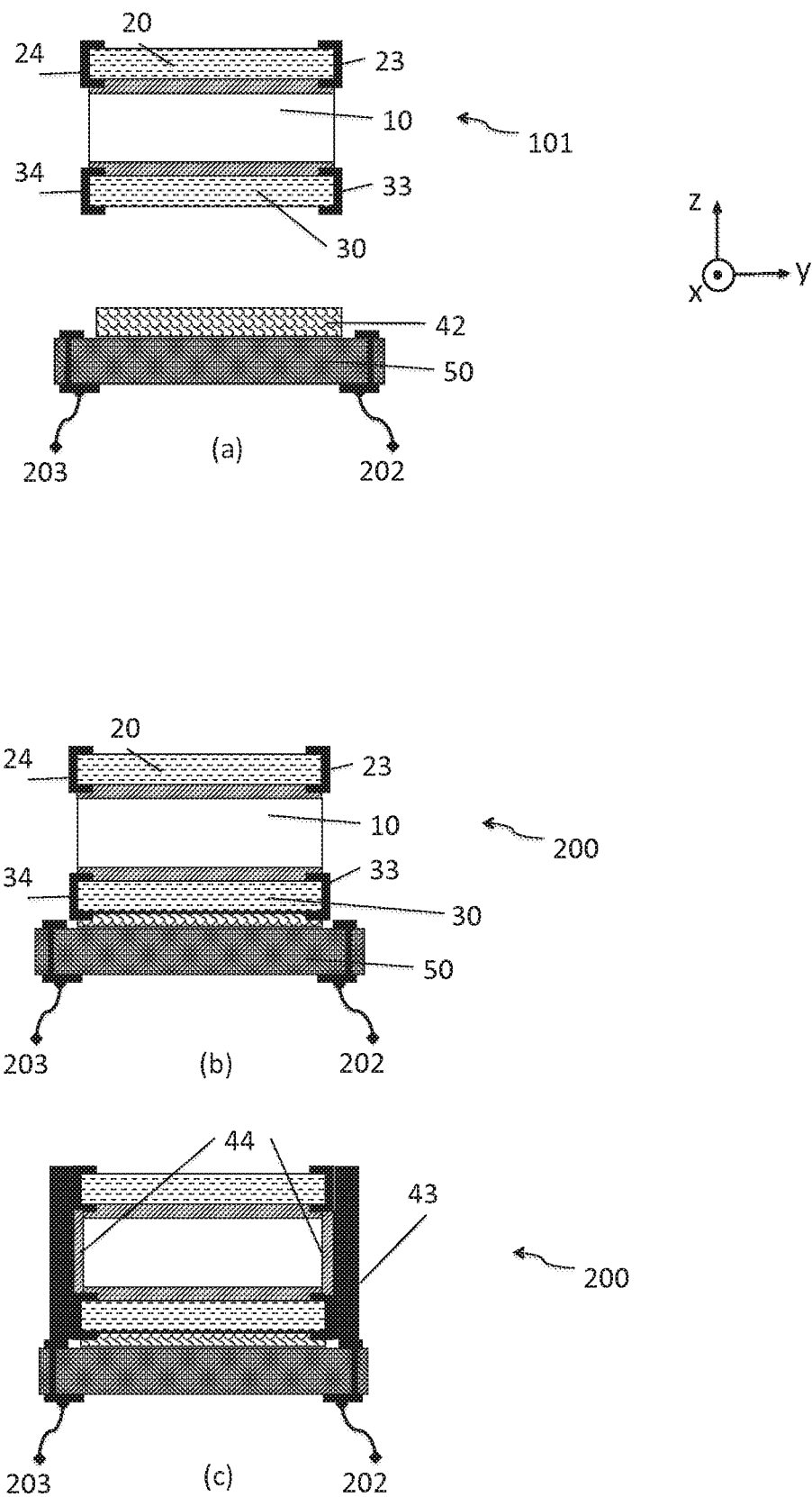
FIG. 4, Panels (a) through (c), shows a method of manufacturing a converter according to the disclosure.

As shown in FIG. 4, Panels (a) through (c), one electrical terminal 202 is electrically connected to one of the interdigitated electrodes 23, 33, the other electrical terminal 203 is connected to the other of the interdigitated electrodes 24, 34, via a backing layer 50. By way of example, this backing layer 50 may comprise a printed circuit (also known as a PCB meaning "printed circuit board"). The backing layer 50 may, for example, be assembled by means of a layer of adhesive 42 on the free face of the second layer 20 or third layer 30 of the stack of layers 100 or 101 (FIG. 4, Panel (a)). As illustrated in FIG. 4, Panel (a), the backing layer 50 may comprise electrical terminals 202, 203 on the rear face, with its front face being joined to the stack of layers 100, 101. These electrical terminals 202, 203 can thus be subsequently connected to other elements in order to produce the electricity generator 400.

The electrical connection between the interdigitated electrodes 23, 24, 33, 34 and the contacts of the backing layer 50 (capable of being connected to the two electrical terminals, which will undergo the electrical potential difference) can be established by means of conductive adhesive strips 43 deposited on the side edge of the converter 200, in particular, on the side edge of the stack of layers 100, 101 and the side edge or edge of the backing layer 50. "Side edge" signifies the lateral surfaces connecting the main faces of the layers, with the main faces being parallel to the plane (x, y) in the figures. The "layer edges" correspond to a peripheral portion on a main face. The side edge of the first layer 10 of magnetostrictive material will have been covered beforehand with an electrically insulating film 44, in particular, in order to prevent the conductive adhesive strips 43 from being in short circuit, in contact with the first layer 10 (FIG. 4, Panel (c)).

Alternatively, the electrical connection between the interdigitated electrodes 23, 24, 33, 34 and the contacts of the backing layer 50 can be made by means of wire bonding. These wire bondings may run from the face of the second (and/or third) layer 20 comprising the electrodes or from its side edge to one of the faces of the backing layer 50 or its side edge.

Alternatively, the electrical connection between the interdigitated electrodes 23, 24, 33, 34 and the contacts of the backing layer 50 can be established by means of conductive vias passing through the stack of layers (100, 101).

The backing layer 50 will advantageously have a shape similar to that of the stack of layers 100, 101, for example, a circular shape. According to one alternative, it can be joined to a second printed circuit comprising devices for collecting the charges generated on the electrodes (23, 24, 33, 34), for storage of the charges and/or for processing of the induced electrical signal.

According to another advantageous alternative, the backing layer 50 may itself include at least one switch device for collecting the charges generated on the electrodes (23, 24, 33, 34). It may also include at least one storage device of the charges generated on the electrodes (23, 24, 33, 34). It may also include at least one device for processing of the electrical signal induced by the charges generated on the electrodes (23, 24, 33, 34).

According to yet another advantageous alternative, a buffer layer, consisting of at least one material with sound-absorbing properties, is arranged between the stack of layers 100, 101 and the backing layer 50. This buffer layer is joined together, on the one hand, with the stack of layers 100, 101 and, on the other hand, with the backing layer 50, via a layer of adhesive.

In the converter 200, the role of the buffer layer will be to absorb the acoustic waves that can be generated by the sudden change in shape and/or state of stress of the second (and/or third) layer 20, 30 of piezoelectric material that may occur at the time of charge recovery on the terminals of the converter 200 (collection of charges will be dealt with in further detail below during description of the generator). These acoustic waves result in an audible click at each charge recovery, which may be annoying for some applications. The buffer layer absorbs or at least significantly dampens this sound, thus eliminating or attenuating the sound inconvenience.

In a non-limiting example embodiment, the buffer layer may be advantageously composed of a honeycomb material, particularly with open cells. By way of example, a material such as polyurethane foam may be used.

In order to form the electricity generator 400, the magneto-electric converter 200 can be placed in a housing defined by a magnetic field source 300, in which a magnetic field B prevails, with part of the field lines being included in a reference plane defined by the first layer 10 of magnetostrictive material of the converter 200. The converter 200 advantageously has a circular shape, a diameter of less than 3 cm and a diameter-to-thickness ratio of more than 3. A particularly compact electricity generator 400 is thus created. The magnetic field source 300 and the converter 200 can rotate in relation to each other so as to vary the orientation of the magnetic field B in the reference plane. The converter 200 is thus penetrated by a preferably uniform magnetic field B and oriented in an initial direction $B_0$ in the reference plane (x, y). The variation in this magnetic field is intended to be converted into an electrical potential difference between the two electrical terminals 202, 203 of the converter 200.

Advantageously, the converter will be positioned in the housing of the magnetic field source 300 so that the initial field direction $B_0$ is parallel or perpendicular to the first polarization axis 21 and/or second polarization axis 31 of the second layer 20 and third layer 30 of piezoelectric material.

Figure 5:
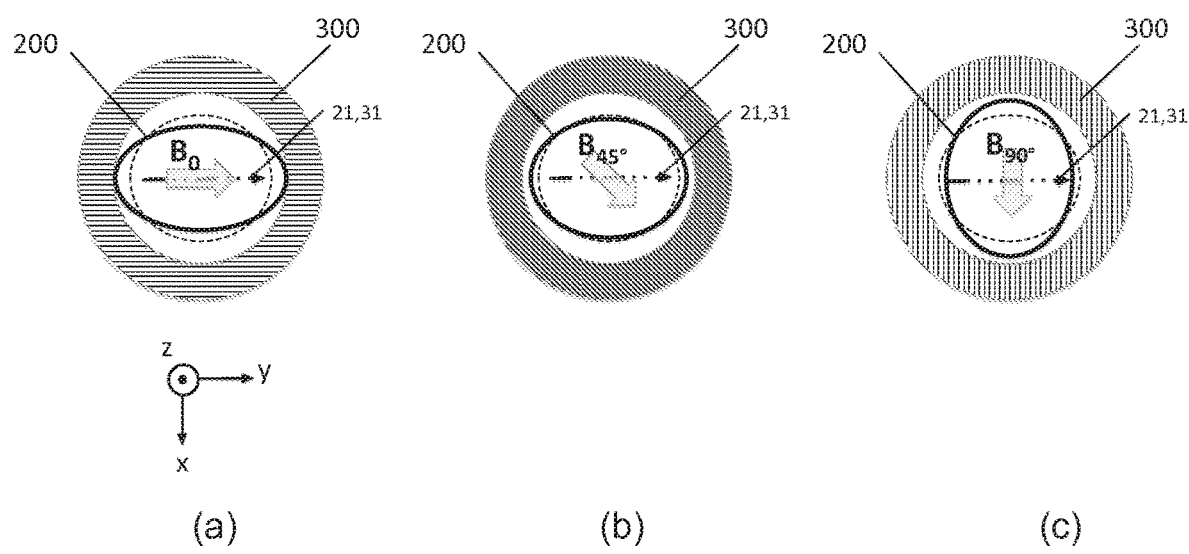
FIG. 5, Panels (a) through (c), shows a block diagram of the operation of a compact electricity generator according to the disclosure.

As shown in FIG. 5, Panel (a), under the action of the magnetic field $B_0$, the first layer 10 of magnetostrictive material is magnetized and undergoes deformation along the y axis, parallel to the magnetic field $B_0$. This deformation corresponds to an extension of the stack of layers 100, 101 in the reference plane along the y axis (parallel to the first and second polarization axes 21, 31 according to the example shown in FIG. 5, Panel (a)), which will subsequently be designated "maximum extension." The stack of layers 100, 101 simultaneously undergoes contraction (i.e., negative extension, which will subsequently be designated "minimal extension") in the reference plane (x, y) along the x axis. The deformation of the first layer 10 is shown schematically in FIG. 5, Panel (a), by the oval-shaped distortion of the converter 200 along the y axis. This deformation is applied to the second layer 20 (and, if present, to the third layer 30) and corresponds to an initial state of the converter 200.

In order to vary the magnetic field, its orientation is, for example, rotated clockwise from the initial direction $B_0$ toward a direction $B_{45°}$ (as illustrated in FIG. 5, Panel (b)) by rotating the magnetic field source 300. Alternatively, the converter 200 can be rotated. Consequently, the stack of layers 100, 101 of the converter 200 is transformed from its initial state to a second state in which:
  the first layer 10 will shrink along the y axis, from maximum extension to a lesser average extension, owing to the reduction in the component of the magnetic field B along the y axis;
  the first layer 10 will furthermore stretch along the x axis, from minimum extension (maximum contraction) to a greater average extension.

The variation in the magnetic field (by a rotation in its direction) thus induces variations in the deformation of the first layer 10. The latter transmits these variations to the second layer 20 (and potentially third layer 30), joined to the first layer 10 in the stack of layers 100, 101.

If one continues to rotate the orientation of the magnetic field from the direction $B_{45°}$ toward direction $B_{90°}$, in the clockwise direction (as illustrated in FIG. 5, Panel (c)), the stack of layers 100, 101 will be transformed from the second state to a third state in which:

the first layer 10 still shrinks along the y axis, from an average extension to minimum extension (maximum shrinkage);

the first layer 10 stretches along the x axis, from an average extension to maximum extension along the x axis, taking into account the alignment of the magnetic field with this axis.

The variation in the magnetic field B between the initial position and the third position has, therefore, caused variations in deformation of the first layer 10, transmitted to the second layer 20 (and potentially the third layer 30). The second and third layers 20, 30 of piezoelectric material function in $d_{33}$ mode, i.e., the polarization axis is in the plane of the layer and, therefore, generation of charges in the material is sensitive to the deformations in this same plane.

In the case of the converter 200 according to the described advantageous configuration of the disclosure, the second and third layers 20, 30 undergo, along their first and second polarization axes 21, 31, between the initial state and the third state, maximum deformation from a maximum extension to a minimum extension (maximum shrinkage). A maximum quantity of charges (e.g., negative charges) can, therefore, be accumulated on one of the interdigitated electrodes (e.g., 23, 33) and be collected at one of the electrical terminals of the generator, for instance, on a capacitive device.

This first sequence of variation in the magnetic field (from $B_0$ to $B_{90°}$), transforming the converter 200 from the initial state to the third state, can thus generate an electrical potential difference between the electrical terminals 202, 203: this potential difference is great owing to the configuration of the converter 200 according to the disclosure, ensuring good efficiency of the converter 200 in a compact configuration of an electricity generator 400.

Following collection of the charges in the third state, the electrical potential difference between the electrical terminals 202, 203 is zero and the structure of the converter 200 is in a fourth state considered a new initial state. The variation in the magnetic field (from $B_{90°}$ to $B_{180°}$) in the clockwise direction, will transform the state of layers 100, 101 from a fourth initial state to a fifth state in which:

the first layer stretches along the y axis, from a minimum extension to maximum extension, taking into account the alignment of the field with this axis.

the first layer shrinks along the x axis, from a maximum extension to minimum extension (maximum shrinkage).

The second layer 20 (and if present, the third layer 30) undergoes a maximum deformation along its first and second polarization axes 21, 31, between the fourth initial state and the fifth state, from a state of minimum extension to a state of maximum extension. A maximum quantity of charges (for example, positive charges) can, therefore, be accumulated on the other of the interdigitated electrodes 24, 34 and be collected at one of the electrical terminals of the generator.

The disclosure thus proposes an electricity generator 400 that is compact, including an efficient magneto-electric converter 200, capable of generating a large amount of charges, every quarter turn of a relative rotary motion between the magnetic field source 300 and the converter 200.

In some cases, the magnetic field source 300 is advantageously selected so that the uniform magnetic field strength prevailing in the housing is less than the strength required to magnetically saturate the first layer 10 of magnetostrictive material. The electricity generator 400 according to the disclosure can thus offer the advantage of improved robustness. Indeed, the converter 200 displays greater mechanical resistance to the deformation cycles owing to the fact that the first layer 10 of magnetostrictive material does not work in a magnetic saturation mode. Longevity in terms of deformation cycles of the converters 200 according to the disclosure can be increased by a factor of 10 to 1000 compared to converters operating in magnetic saturation in a generator. Furthermore, the weakness of the magnetic field limits the amplitude of a parasitic torque that may be applied to the converter tending to place its preferential axis of deformation in the alignment of the field when the magnetostrictive material forming this converter is not isotropic.

Exemplary Embodiment

According to an exemplary embodiment of the disclosure, the stack of layers 101 is formed by assembling a second layer 20 and a third layer 30 of PZT on each of the faces of a first layer 10 of Terfenol-D. The layer 10 has, for example, a circular dimension, a thickness of 1 mm and a diameter of 2 cm. Each layer of PZT has a thickness of, for example, 100 microns and a diameter of 2 cm. In this exemplary embodiment, each second layer 20 and third layer 30 has interdigitated electrodes 23, 24, 33, 34 on each of its faces. Such a configuration encourages efficiency in generating charges in response to deformation. These electrodes come in the form of combs; the fingers of the combs are perpendicular to the polarization axis of the material. The second and third PZT layers 20, 30 have first and second polarization axes 21, 31, respectively, in the plane of the layer. A layer of electrically non-conductive adhesive 40 is applied to the face of the second layer 20 to be assembled; the first layer 10 is placed on top, in front of the face of the second layer 20. Pressure is subsequently applied to bring the first layer 10 and second layer 20 into contact and spread the layer of adhesive 40 uniformly at the interface. The stack of layers 100 is formed in this manner.

An electrically non-conductive layer of adhesive 41 is subsequently applied to the face of the third layer 30 to be joined; the stack of layers 100 is placed on top and the free face of the first layer 10 is positioned in front of the glued face of the third layer 30. Alignment of the first polarization axis 21 with the second polarization axis 31 can be performed, for example, by visually aligning the combs of the electrodes 23, 24 and 33, 34. It is also possible, in order to achieve this alignment, to have a mark borne by one and the other of the electrodes, providing the latter a local shape that can be easily identified.

Pressure is subsequently applied to bring the faces to be glued into contact and spread the layer of adhesive uniformly at the interface. The alignment accuracy makes it possible to achieve an alignment between the first and second polarization axes 21, 31 at better than 15°. Alternatively, as mentioned above, the polarization axes could be positioned at 90° relative to each other in stack of layers 101.

A printed circuit 50 (or "backing layer"), 2 cm in diameter and a few hundred microns thick is subsequently glued (layer of adhesive 42) on one of its faces to be joined to the free face, for example, of the third layer 30.

A film of adhesive 44 or other electrically non-conductive material is applied to protect and insulate the side edge of the first layer 10 of Terfenol. Strips of conductive material 43 (conductive adhesive, for example) are subsequently applied in order to electrically connect the electrical terminals 202, 203 of the printed circuit 50 and the interdigitated electrodes 23, 24, 33, 34 of the second and third layers 20, 30 of PZT.

The magneto-electric converter 200 can subsequently generate an electrical potential difference between the electrical terminals 202, 203, by applying variations in the magnetic field B, for example, by using a rotating-direction field. The electricity generator 400 preferably comprises a magnetic field source 300 defining a housing within which a magnetic field prevails; the strength of the magnetic field is preferably selected to be less than the strength resulting in magnetic saturation of the first layer 10 of magnetostrictive material. The magneto-electric converter is arranged in this housing, surrounded by the magnetic field. A relative rotational movement between the converter 200 and the magnetic field source 300 generates variation in the field.

The disclosure is not limited to the described embodiments and alternative embodiments can be provided without departing from the context of the disclosure as defined by the claims.

The invention claimed is:

1. An electricity generator comprising a magneto-electric converter capable of converting a variation in a magnetic field into an electrical potential difference between two electrical terminals, the magneto-electric converter comprising:
   backing layer comprising the two electrical terminals and consisting in a rigid printed circuit;
   stack of layers arranged on the backing layer, the stack of layers including:
      first layer of magnetostrictive material defining a reference plane and formed as a monoblock, and
      second layer of piezoelectric material having a first polarization axis in a plane defined by the second layer, parallel to the reference plane, the second layer of piezoelectric material comprising electrodes; and
   electrical connection means for connecting the electrodes to the electrical terminals;
   the electricity generator also comprising a magnetic field source for generating a magnetic field in the reference plane; wherein the magnetic field source and the magneto-electric converter can rotate in relation to each other so as to vary an orientation of the magnetic field in the reference plane.

2. The electricity generator of claim 1, wherein the stack of layers comprises an adhesive layer between the first layer of magnetostrictive material and the second layer of piezoelectric material.

3. The electricity generator of claim 1, wherein the electrodes of the second layer of piezoelectric material comprise interdigitated electrodes present on at least one of two opposing faces of the second layer or on a side edge of the second layer.

4. The electricity generator of claim 1, wherein the piezoelectric material comprises a material selected from a group consisting of PZT, PMN-PT, PVDF, BaTiO$_3$ and AlN.

5. The electricity generator of claim 1, wherein the magnetostrictive material comprises a material selected from a group consisting of crystalline or sintered Terfenol-D, Galfenol, Terbium Iron, Iron-Cobalt, Iron-Nickel and amorphous FeSiB.

6. The electricity generator of claim 1, wherein the electrical connection means for connecting the electrodes to the electrical terminals comprise at least two wire bondings.

7. The electricity generator of claim 1, wherein the electrical connection means for connecting the electrodes to the electrical terminals comprise at least two conductive through vias in the stack of layers.

8. The electricity generator of claim 1, wherein the magnetic field source defines a housing in which the magnetic field prevails, the magneto-electric converter being located in the housing.

9. The electricity generator of claim 1, wherein the magnetic field source comprises a Halbach cylinder.

10. The electricity generator of claim 1, wherein the electrodes of the second layer of piezoelectric material comprise a conductive material arranged in a thickness of the second layer, a finger of an electrode present on one face of the second layer extending into the thickness, forming a through-blade of conductive material.

11. The electricity generator of claim 1, wherein the stack of layers comprises a third layer of piezoelectric material having a second polarization axis in a plane defined by the third layer, wherein the first layer of magnetostrictive material is arranged between the second layer of piezoelectric material and the third layer of piezoelectric material, and the second polarization axis is aligned with the first polarization axis or is within 15° to a line perpendicular to the first polarization axis.

12. The electricity generator of claim 11, wherein metal electrodes of the third layer of piezoelectric material are interdigitated electrodes present on at least one of two opposing faces of the third layer.

13. The electricity generator of claim 1, wherein the stack of layers and the backing layer are circular in shape.

14. The electricity generator of claim 13, wherein the magneto-electric converter has a diameter less than 3 cm, and wherein a ratio of the diameter to a thickness of magneto-electric converter is more than 3.

15. The electricity generator of claim 1, wherein the electrical connection means for connecting the electrodes to the two electrical terminals comprise at least two strips of conductive material arranged on a side edge of the stack of layers and on a side edge of the backing layer.

16. The electricity generator of claim 15, wherein the side edge of the first layer of magnetostrictive material is separated from the strips of conductive material by a layer of insulating material.

* * * * *

UNITED STATES PATENT AND TRADEMARK OFFICE
CERTIFICATE OF CORRECTION

PATENT NO. : 11,316,093 B2
APPLICATION NO. : 16/093550
DATED : April 26, 2022
INVENTOR(S) : Jérôme Delamare, Thibault Ricart and Jérémie Guillen It is certified that error appears in the above-identified patent and that said Letters Patent is hereby corrected as shown below:

In the Specification
Column 9, Line 30, change "$B_{900}$" to --$B_{90°}$--
Column 9, Line 41, change "$B_{180°}$" --to $B_{180°}$--

In the Claims
Claim 1, Column 11, Line 26, change "backing" to --a backing--
Claim 1, Column 11, Line 28, change "stack" to --a stack--
Claim 1, Column 11, Line 30, change "first" to --a first--
Claim 1, Column 11, Line 32, change "second" to --a second--
Claim 14, Column 12, Line 45, change "magneto-electric" to --said magneto-electric--

Signed and Sealed this
Twenty-seventh Day of February, 2024

Katherine Kelly Vidal
*Director of the United States Patent and Trademark Office*